(12) United States Patent
Hamada

(10) Patent No.: US 6,232,622 B1
(45) Date of Patent: May 15, 2001

(54) SEMICONDUCTOR DEVICE WITH HIGH ELECTRIC FIELD EFFECT MOBILITY

(75) Inventor: Hiroki Hamada, Hirakata (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/406,819

(22) Filed: Sep. 28, 1999

(30) Foreign Application Priority Data

Sep. 30, 1998 (JP) .................................................. 10-277359

(51) Int. Cl.[7] ......................... H01L 29/76; H01L 31/036; H01L 31/112
(52) U.S. Cl. ................................. 257/67; 257/59; 257/72; 257/350
(58) Field of Search .................. 257/57, 59, 67, 257/72, 347, 350, 352

(56) References Cited

U.S. PATENT DOCUMENTS

| | | | |
|---|---|---|---|
| 5,801,400 | * | 9/1998 | Nishihata ............................. 257/72 |
| 5,917,225 | * | 6/1999 | Yamazaki et al. .................... 257/411 |
| 5,936,292 | * | 8/1999 | Koide et al. ......................... 257/412 |
| 5,939,731 | * | 8/1999 | Yamazaki et al. ..................... 257/59 |
| 5,959,313 | * | 9/1999 | Yamazaki et al. ..................... 257/59 |
| 6,049,091 | * | 4/2000 | Yokoyama ............................ 257/52 |

* cited by examiner

*Primary Examiner*—Ngân V. Ngô
(74) *Attorney, Agent, or Firm*—Armstrong, Westerman, Hattori, McLeland & Naughton LLP

(57) ABSTRACT

A polycrystalline silicon TFT of a top-gate type having a polycrystalline silicon film functioning as an active layer on a transparent insulating substrate. A gate electrode is provided on a channel region of the polycrystalline silicon film via a gate insulating film. On both sides of the channel region, source-drain regions of LDD structure consisting of low impurity concentration regions and high impurity concentration regions are provided. In the channel region of the polycrystalline silicon film, multiple monocrystal regions connecting source-drain regions are provided perpendicular to the transparent insulating substrate. Though electrons cannot smoothly pass through the channel region of the polycrystalline silicon film because of crystal grain boundaries and crystal defects therein, electric field effect mobility can be heightened by providing monocrystal regions, since electrons can smoothly pass through the monocrystal regions.

20 Claims, 18 Drawing Sheets

LASER IRRADIATION

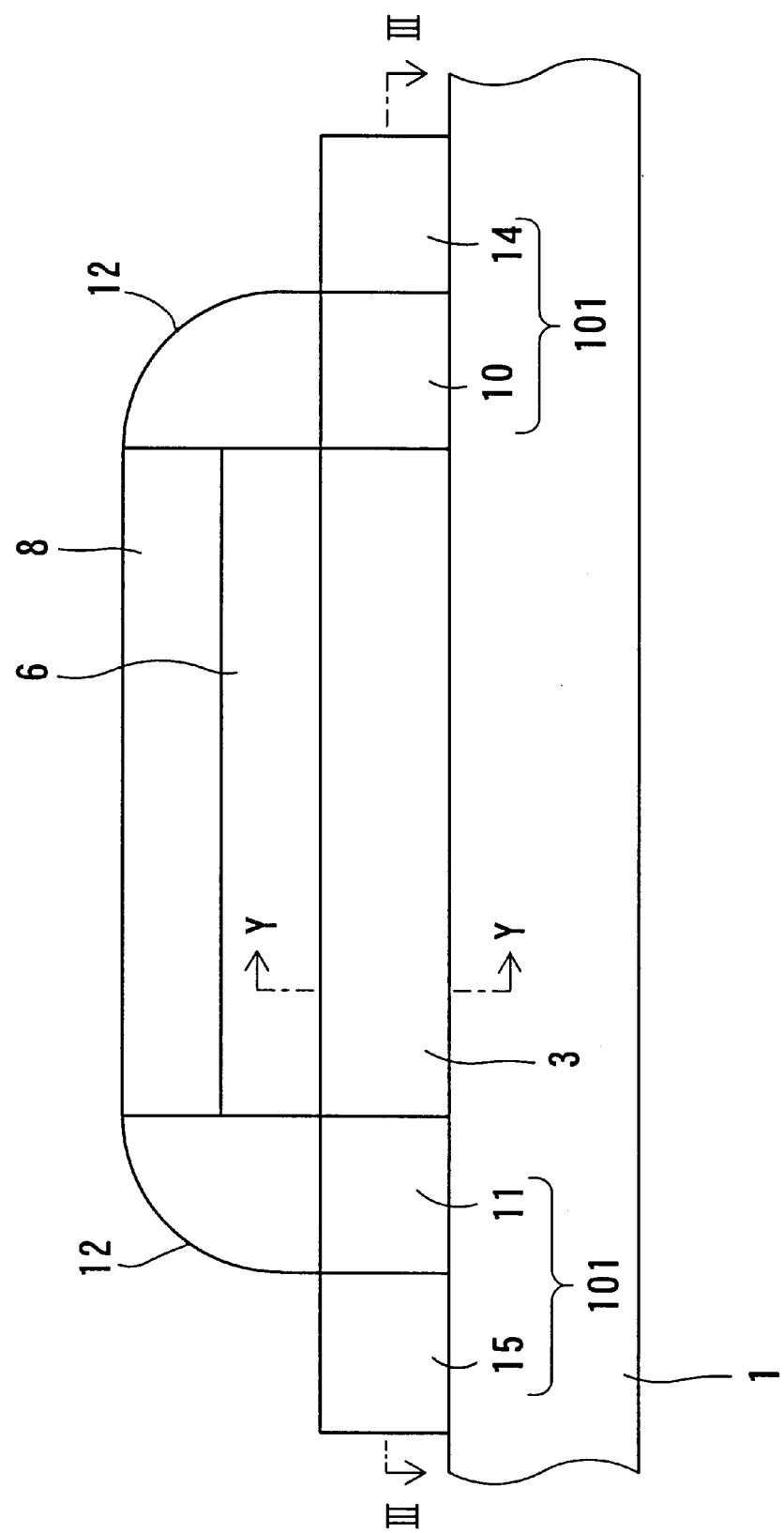

FIG. 15D
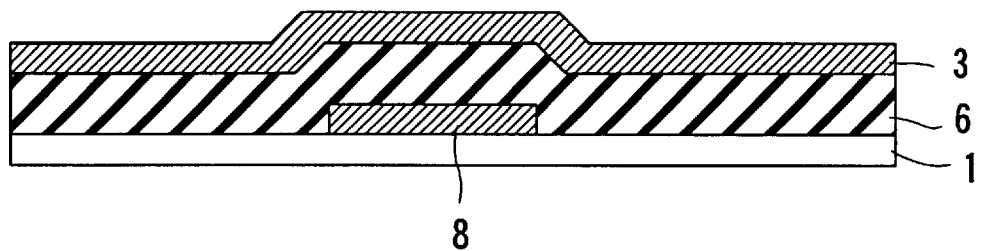
FIG. 15E
LASER IRRADIATION
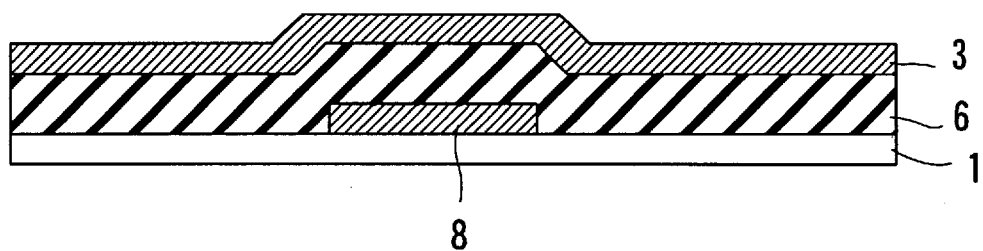
FIG. 15F
HEAT TREATMENT
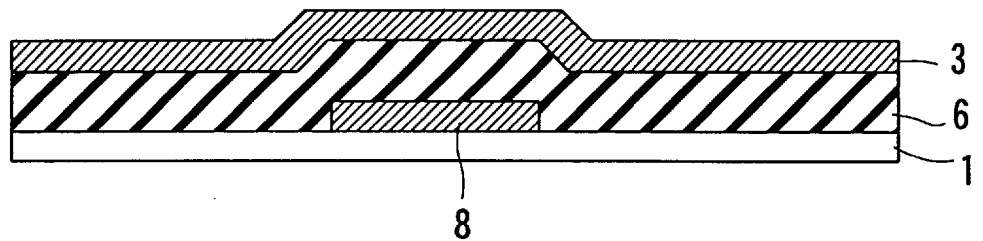

SEMICONDUCTOR DEVICE WITH HIGH ELECTRIC FIELD EFFECT MOBILITY

TECHNICAL FIELD OF THE INVENTION

The invention is related to a semiconductor device and more specifically to a semiconductor device with heightened electric field effect mobility.

BACKGROUND OF THE INVENTION

A liquid crystal display (referred to as LCD, hereinafter) is composed of display picture elements disposed in a matrix arrangement and driving circuits which drives the display picture elements. In order to improve the displaying performance of the LCD, high electric field effect mobility is required for the transistors constituting the driving circuits, since a higher operation speed is demanded for such transistors compared with transistors constituting display picture elements.

Recently, fairly high electric field effect mobility has been achieved by using a polycrystalline silicon film as an active layer of a thin film transistor (referred to as TFT, hereinafter) constituting driving circuits.

Hence, TFTs (polycrystalline silicon TFTs) comprising polycrystalline silicon films as active layers have come to be used not only for transistors constituting display picture elements but also for transistors constituting driving circuits. Also an integrated type of LCD, where both of display picture elements and driving circuits are composed of polycrystalline silicon TFTs and formed on the same insulating substrate, has been developed.

For the LCD in which the display picture elements and the driving circuits are composed of polycrystalline silicon TFTs, higher mobility (higher speed) of the polycrystalline silicon TFT is required as the display picture element becomes finer.

A polycrystalline silicon film comprises multiple monocrystal grains and crystal grain boundaries are formed between these crystal grains. The polycrystalline silicon film also contains crystal defects. Therefore, when a polycrystalline silicon film is used as an active layer, electrons which pass through the polycrystalline silicon film are scattered by crystal grain boundaries and crystal defects, and cannot smoothly pass through a channel regions formed in the active layer. As a result, there is a problem that the electric field effect mobility of the polycrystalline silicon TFT cannot be so high as that of a TFT in which a monocrystalline silicon film is used as an active layer.

Therefore, there is a problem that the improvement of displaying performance of the LCD is limited when the display picture elements and the driving circuits of the LCD are composed of polycrystalline silicon TFTs.

SUMMARY OF THE INVENTION

The object of the invention is to present a semiconductor device provided with a semiconductor film which functions as an active layer of a transistor with high electric field effect mobility.

In order to attain this and other objects of the invention, there is proposed a semiconductor device comprising an insulating substrate, a non-monocrystalline semiconductor film which is formed on the insulating substrate and functions as a channel region of a transistor and as source-drain regions located across the channel region and a region which comprises a crystalline semiconductor formed in the non-monocrystalline semiconductor film of the channel region and whose properties are different from those of the non-monocrystalline semiconductor film.

Preferably, the non-monocrystalline semiconductor film is a polycrystalline semiconductor film and the crystalline semiconductor film is a monocrystalline semiconductor film. By providing the monocrystal region, electric field effect mobility can be heightened since electrons pass mainly through the monocrystal region, and cannot smoothly pass through a channel region of a polycrystal semiconductor film because of crystal grain boundaries and crystal defects therein.

In the invention, the non-monocrystalline semiconductor film may be an amorphous semiconductor and the crystalline semiconductor may be a monocrystalline semiconductor or a polycrystalline semiconductor. By providing the monocrystal or polycrystal region, electric field effect mobility can be heightened since electrons pass mainly through the monocrystal or polycrystal region, though electrons cannot smoothly pass through a channel region of an amorphous semiconductor film.

The invention further provides a liquid crystal display comprising a pair of insulating substrates disposed at a predetermined distance from each other, a display electrode defining a picture element disposed on one of the pair of insulating substrates, a liquid crystal filled between the pair of insulating substrates and a transistor for driving the picture element formed on one of the pair of the insulating substrates, wherein the transistor comprises a non-monocrystalline semiconductor film functioning as a channel region of the transistor, a region which comprises a crystalline semiconductor formed in a non-monocrystalline semiconductor film and whose properties are different from those of the non-monocrystalline semiconductor film, source-drain regions located across the channel region, and a gate electrode provided on the channel region via an insulating film.

Preferably, the non-monocrystalline semiconductor film is a polycrystalline semiconductor film and the crystalline semiconductor is a monocrystalline semiconductor.

The non-monocrystalline semiconductor film may be an amorphous semiconductor film and the crystalline semiconductor may be a monocrystalline semiconductor or a polycrystalline semiconductor.

Further, the transistor for such a liquid crystal display may either be of a top-gate type or a bottom-gate type.

BRIEF DESCRIPTION OF THE DRAWINGS

The invention will now be described, by way of example, with reference to the drawings, in which:

FIG. 2 is a schematic cross-sectional view of the semiconductor device (polycrystalline silicon TFT) of the first embodiment manufactured according to the manufacturing steps shown in FIGS. 1A to 1L;

FIGS. 15A to 15K are schematic cross-sectional views illustrating a manufacturing process of a semiconductor device (polycrystalline silicon TFT) according to a third embodiment of the invention.

DETAILED DESCRIPTION OF PREFERRED EMBODIMENTS

Preferred embodiments will be described as follows, referring to drawing figures. The same notations are used for the same constituents, whose detailed explanations are omitted.

The First Embodiment

A manufacturing process of a semiconductor device (polycrystal silicon TFT) of the first embodiment of the invention will be described, referring to FIGS. 1A to 1L.

Figure 1A:
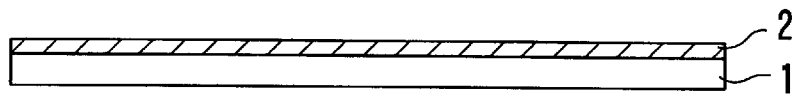
FIGS. 1A to 1L are schematic cross-sectional views illustrating a manufacturing process of a semiconductor device (polycrystalline silicon TFT) according to a first preferred embodiment of the invention.

In FIG. 1A, an amorphous silicon film (an amorphous semiconductor film) 2 having a thickness of approximately 100 nm is formed at about 450° C. on a transparent insulating substrate 1 made of glass or quartz glass by means of LPCVD (Low Pressure Chemical Vapor Deposition) by using Si2H6 (disilane gas) as raw material gas.

Figure 1B:
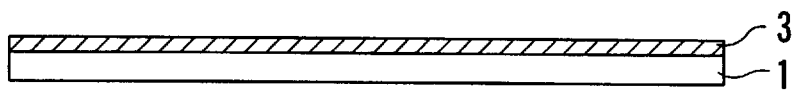

In FIG. 1B, the film 2 is annealed at about 600° C. for about 20 hours by means of SPC (Solid Phase Crystallization). The amorphous silicon film 2 is polycrystallized and converted to a polycrystalline silicon film (polycrystal semiconductor film) 3. By this process, the thickness of the polycrystalline silicon film 3 is decreased to about 90 nm.

Figure 1C:
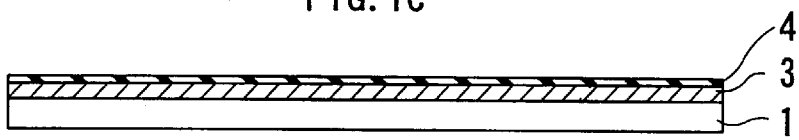

In FIG. 1C, the surface of the polycrystalline silicon film 3 is dry-oxidized in an atmosphere containing oxygen at about 1050° C. to form a silicon dioxide film (SiO2) 4 with a thickness of about 20 nm on the surface.

Figure 1D:
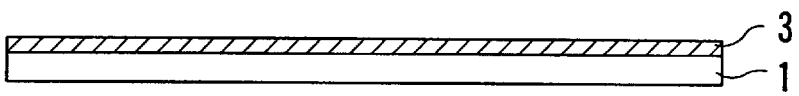

In FIG. 1D, the silicon dioxide film 4 is removed by wet-etching with an etchant of the hydrofluoric acid family to expose the surface of the polycrystalline silicon film 3. When the silicon dioxide film 4 is removed in this way, after it has been formed by oxidizing the surface of the polycrystalline silicon film 3, the crystallinity of the polycrystalline silicon film 3 is increased. The polycrystalline silicon film 3 corresponds to the active layer of the polycrystalline silicon TFT.

Figure 1E:
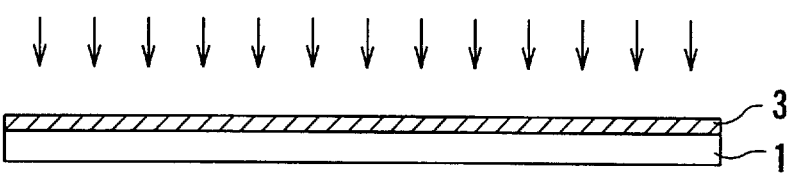

In FIG. 1E, a monocrystal region consisting of monocrystalline silicon is formed in a portion defining a channel region between the source-drain regions on the polycrystalline silicon film 3.

Figure 1F:
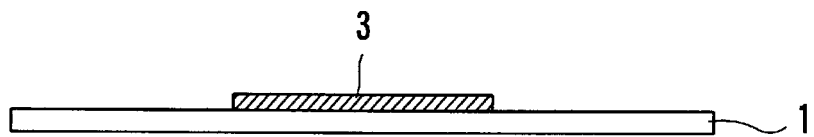

In FIG. 1F, patterning of the polycrystalline silicon film 3, in which a monocrystal region is formed, is carried out by means of the photolithography technique and the dry-etching technique by RIE (Reactive Ion Etching) method. By this process, the polycrystalline silicon film 3 is left only in the region where a TFT is to be formed.

Figure 1G:
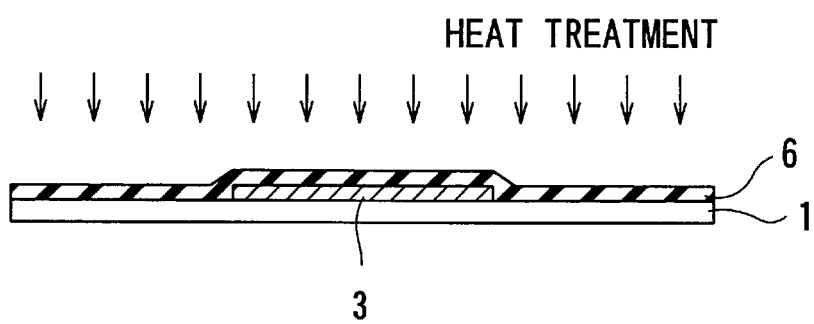

In FIG. 1G, an HTO film (High Temperature Oxide: oxidized silicon film) which functions as a gate insulating film 6 is formed on the polycrystalline silicon film 3 already patterned by means of LPCVD.

Then, heat treatment is carried out by placing the transparent insulating substrate 1 into an electric furnace in an atmosphere of nitrogen at about 1050° C. for about 2 hours.

The heat treatment may be a rapid heat treatment according to RTA (Rapid Thermal Annealing). In this case, the heat treatment conditions are as follows: The heat source is a xenon (Xe) arc lamp, annealing is conducted at a temperature of: and about 900° C. to about 1100° C. (preferably, about 950° C. to about 1100° C.), in a atmosphere of nitrogen for about 1 to about 10 seconds. Since the heating according to RTA is carried out in a very short period of time, though at high temperature, the transparent insulating substrate 1 is effectively prevented from being deformed by the heat treatment, while crystal defects and the like in the polycrystalline silicon film 3 are decreased by the high temperature heat treatment.

Figure 1H:
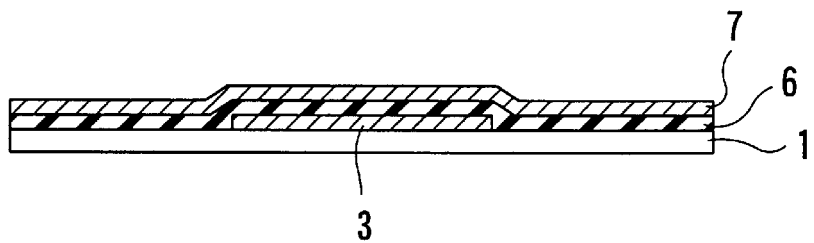

In FIG. 1H, a polycrystalline silicon film 7 doped with phosphorus, which becomes a gate electrode 8, is formed on the gate insulating film by means of LPCVD, though the doping of phosphorus on the polycrystalline silicon film 7 is not always necessary.

Figure 1I:
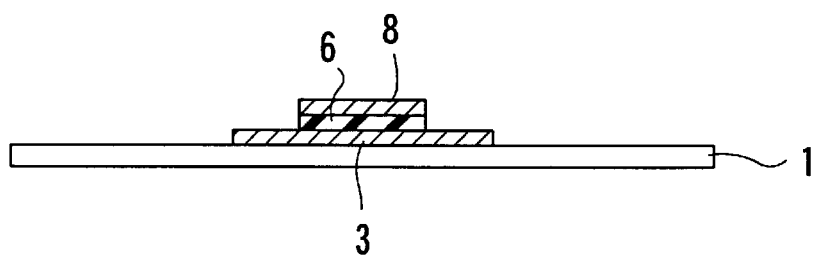

In FIG. 1I, patterning of the polycrystalline silicon film 7 and the gate insulating film 6 thereunder is carried out by means of a photolithography technique and the dry-etching technique by RIE. By this process, the gate electrode 8 is formed from the polycrystalline silicon film 7 so that the polycrystalline silicon film 7 and the gate insulating film 6 remain only on the channel region of the polycrystalline silicon film 3.

Figure 1J:
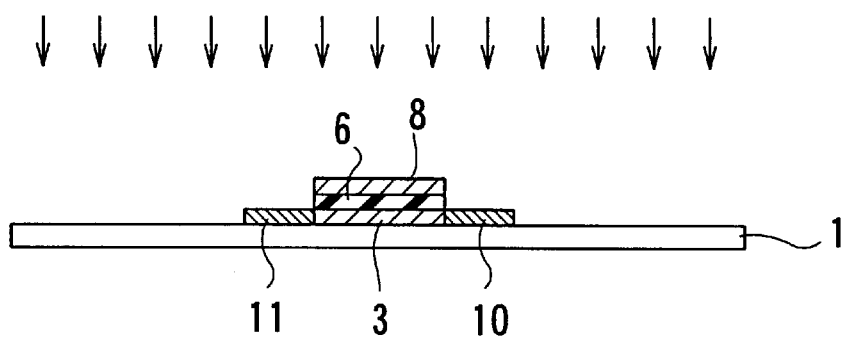

In FIG. 1J, impurities are implanted into the upper surfaces of the exposed polycrystalline silicon film 3 and the gate electrode 8. Then, the implanted impurities are activated by applying heat treatment.

As the n-type impurities for the implantation, arsenic (As) or phosphorus (P) is used and the implantation conditions are about 80 keV and about $3 \times 10^{13}/cm^2$. As the p-type impurities, boron (B) is used and the implantation conditions are about 30 keV and about $1.5 \times 10^{13}/cm^2$. An electric furnace is used for the heat treatment and the heat treatment conditions are about 850° C., about 30 minutes and about 5 liters/minute of $N_2$ gas.

By carrying out such implantation of impurities and heat treatment, low impurity concentration regions 10 and 11 are formed within the portions of the polycrystalline silicon film 3 exposed from the gate electrode 8.

A rapid heat treatment by RTA may be used for the heat treatment. In this case, the conditions of the heat treatment are as follows: the heat source is a Xe arc lamp, the temperature is about 700° C. to about 950° C., in $N_2$ atmosphere and the heating time is about 1 to about 3 seconds.

Figure 1K:
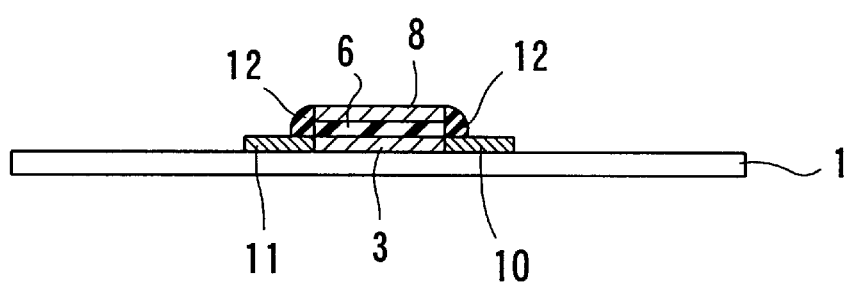

In FIG. 1K, after an insulating film is deposited on the transparent insulating substrate 1 by means of APCVD (Atmospheric Pressure CVD) so as to cover the polycrystalline silicon film 3 and the gate electrode 8, the insulating film is etched by means of anisotropic etchback on the whole surface, to form side walls 12 consisting of the insulating film on the side faces of the gate electrode 8 and insulating film 6.

Figure 1L:
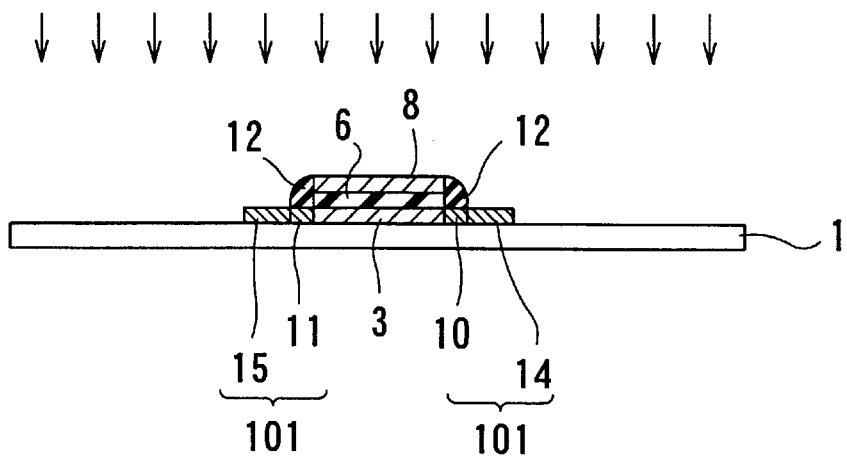

In FIG. 1L, impurities are implanted into the polycrystalline silicon film 3 with the side walls 12 and the gate electrode being used as masks. Further, the implanted impurities are activated by means of heat treatment.

In the case of type n, phosphorus is used as the impurities. The conditions of implantation are about 80 keV and about $1.3 \times 10^{15}/cm^2$. In the case of type p, boron (B) is used as the impurities, and the implantation conditions are about 30

KeV and about $1.5×10^{15}/cm^2$. An electric furnace or RTA is used for the heat treatment in the same way and with heat treatment conditions the same as those in the step of FIG. 1J.

By the implantation of impurities and heat treatment as mentioned above, high impurity concentration regions 14 and 15 are formed in a self-aligning manner within the portions of the polycrystalline silicon film 3 which are exposed from the side wall 12 and gate electrode 8.

According to the above-mentioned process, there is formed a top-gate type polycrystalline silicon TFT. As shown in FIG. 2, in the completed top-gate type polycrystalline silicon TFT, the polycrystalline silicon film 3 formed on the transparent insulating substrate 1 and provided with a monocrystal region is used as an active layer. The top-gate type polycrystalline silicon TFT is provided with source-drain regions 101 of LDD (Lightly Doped Drain) structure consisting of the low impurity concentration regions 10,11 and the high impurity concentration regions 14,15.

In the following, practical methods to form a monocrystal region within a region to be defined as a channel region of the polycrystalline silicon film 3 in above-mentioned step of FIG. 1E will be described.

METHOD 1

By irradiating a laser beam linearly to the surface of the polycrystalline silicon film 3 and laser-annealing it, a monocrystal region 102 consisting of a monocrystalline silicon is formed around the region of the film irradiated with the laser beam.

Figure 3:
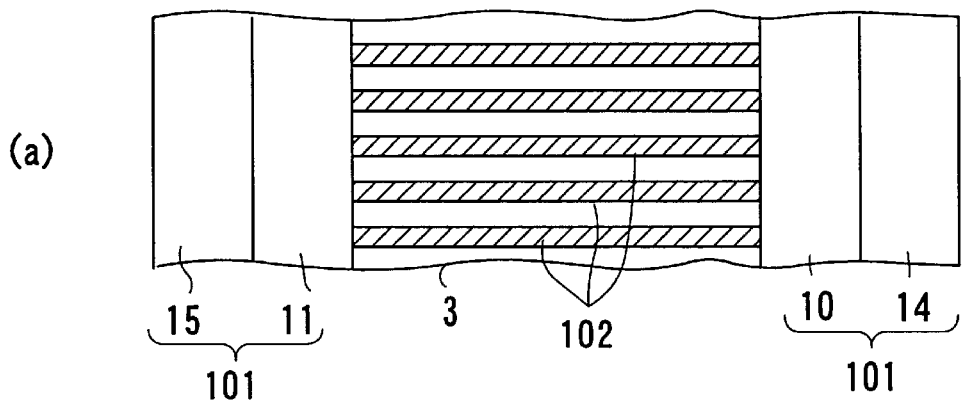
FIG. 3 is a cross-sectional view taken along the line III—III of FIG. 2.

FIG. 3 is a cross-sectional view of the polycrystalline silicon film 3 taken along section line III—III of FIG. 2. As shown in FIG. 3, in the channel region of the polycrystalline silicon film 3, multiple monocrystal regions 102 connecting the source-drain regions 101 (the low concentration impurity regions 10, 11) are formed perpendicular to the transparent insulating substrate 1. Grooves are previously formed by means of grating with a predetermined pitch on the surface of the transparent insulating substrate 1. Aforementioned monocrystal regions 102 are obtained corresponding to the pitch of the grooves by repeatedly scanning irradiation of a laser beam to the film in such a way that the monocrystal regions 102 connect the source-drain regions 101 and the irradiated regions are parallel with one another. The monocrystal regions 102 are uniformly formed from the upper surface (the side of the gate insulating film 6) to the lower surface (the side of the transparent insulating substrate 1) of the polycrystalline silicon film 3.

Instead of previously forming grooves on the surface of the transparent insulating substrate 1 with a predetermined pitch, the substrate 1 may be irradiated by a laser beam of a very narrow width with a predetermined pitch or masked portions may be provided with a predetermined pitch on the polycrystalline silicon film 3 so that a laser beam can irradiate only unmasked portions of the polycrystalline silicon film 3.

Figure 5:
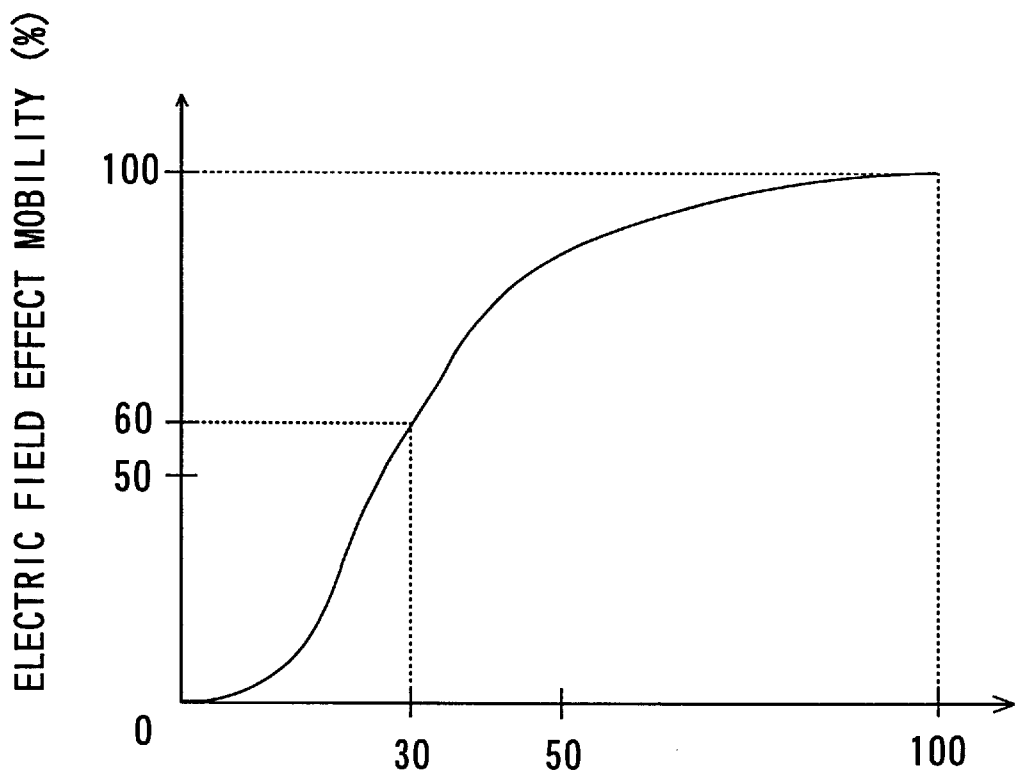
FIG. 5 is a characteristic graph illustrating the effect of the first embodiment.

FIG. 5 shows a relation between the ratio of area occupied by the monocrystal regions 102 in the cross section along the line Y—Y of the polycrystalline silicon film 3 in FIG. 2 and electric field effect mobility of the polycrystalline silicon TFT.

When the area of the monocrystal regions reaches about 30% of the cross-section of the channel region, the value of electric field effect mobility of the polycrystalline silicon TFT reaches about 60% of that of a TFT in which the polycrystalline silicon film 3 is replaced by a monocrystalline silicon film (a TFT in which a monocrystalline silicon film is used as an active layer instead of the polycrystalline silicon film 3).

As aforementioned, multiple monocrystal grains are gathered to form a polycrystalline silicon film 3, with crystal grain boundaries being formed between the monocrystal grains. Crystal defects are also formed in the polycrystalline silicon film 3. Therefore, electrons that pass through the polycrystalline silicon film 3 are scattered by the crystal grain boundaries and crystal defects and cannot smoothly pass through the channel region. However, when monocrystal regions 102 are formed in the channel region of the polycrystalline silicon film 3 as shown in FIG. 3, electrons pass mainly through the monocrystal regions 102, so that electric field effect mobility is heightened.

Suppose that the size (W/L) of a transistor is 5 $\mu$m/5 $\mu$m. When monocrystal regions 102 are not formed in the polycrystalline silicon film 3 (in the case of a conventional semiconductor device), the electric field effect mobility ($\mu$ FE) is not higher than 100 $cm^2$/V . s, threshold value voltage (Vth) is 2–3 V and the sub-threshold value (S value) is 0.3–0.4 V/dec. In contrast, in the case of a transistor of the same size (W=5 $\mu$m, L=5 $\mu$m), on whose polycrystalline silicon film 3 there are formed monocrystal regions 102 occupying about 30% of the area of the channel region, as shown in FIG. 3, electric field effect mobility ($\mu$ FE) is 320 $cm^2$/V . s, the threshold value voltage (Vth) is 0.5 V and the sub-threshold value (S) is 0.1 V/dec. When compared with those of the conventional semiconductor device, $\mu$ FE, Vth and S values are about three times, 1/10 and 1/2.5, respectively.

The range of energy density of laser irradiation is preferably from about 250 to about 600 $mJ/cm^2$, more preferably from about 300 to about 450 $mJ/cm^2$ and most preferably from about 330 to about 400 $mJ/cm^2$. When the energy density of irradiation is higher, the surface of the polycrystalline silicon film 3 tends to be more uneven, and when it is below the range, it is difficult to get good monocrystals and also the surface uniformity tends to be decreased.

The scanning speed of laser irradiation is preferably in the range from about 1 $\mu$m/sec to about 100 mm/sec, more preferably from about 1 mm/sec to about 100 mm/sec and most preferably from about 1 mm/sec to about 20 mm/sec. When the scanning speed is higher, monocrystal regions 102 with less crystal defects tend to be difficult to attain. When the speed is lower, productivity is decreased and at the same time, unevenness of the polycrystalline silicon film 3 is increased.

Though it is preferred that the energy distribution of the laser beam is uniform and broad, the line width of the laser beam is suitably about 0.5–1 mm, since there is a limit in the output power of a laser beam source. The shape of the laser beam differs depending on the irradiation conditions. When its cross-section is close to Gaussian distribution, uniform monocrystals can be easily obtained.

Though the temperature of the transparent insulating substrate 1 only needs to be not lower than room temperature, the substrate 1 may be heated further.

As the lasers beam, various excimer laser can be used such as KrF laser (wavelength: 248 nm), XeCl laser (wavelength: 308 nm), ArF laser (wavelength: 193 nm), F2 laser (wavelength: 157 nm), KrCl laser (wavelength: 222 nm), XeBr laser (wavelength: 282 nm), and XeF laser (wavelength: 351 nm).

Other than excimer lasers, Ar+ laser (wavelength: 488 nm), ruby laser (wavelength: 694 nm), YAG laser (wavelength: 1.06 $\mu$m), $CO_2$ laser (wavelength: 10.6 $\mu$m) and the like can be used, though an excimer laser is more preferably used in order to form monocrystal regions 102, with the laser beam efficiently absorbed by the polycrystalline silicon film 3.

In the irradiation by the laser beam, it is preferred that pulses of a laser beam of a linear shape (width: 0.5–1 mm, length: 20 cm) are generated in such a way that irradiated regions are shifted little by little and continuing irradiated regions partly overlap each other. In addition the throughput can be enhanced by perfectly synchronizing the stage scanning with the pulse laser irradiation, and by irradiating the laser in highly precise superposition.

Figure 4A:
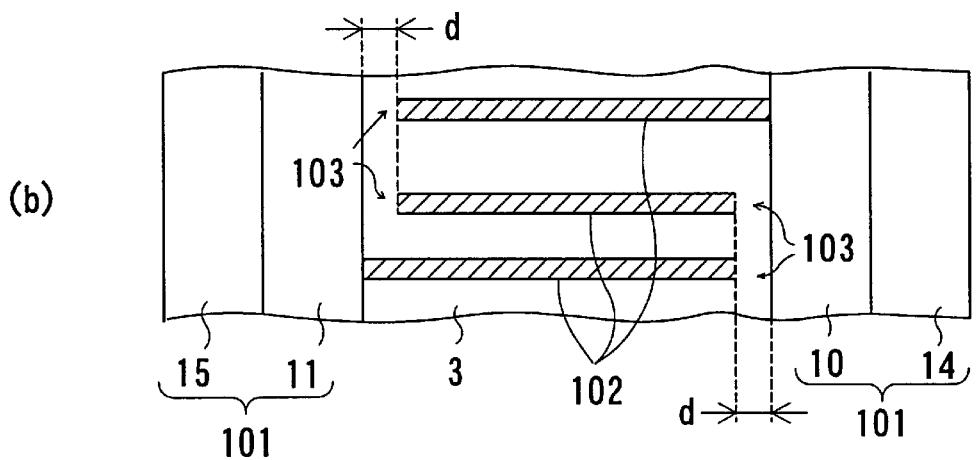
FIGS. 4A and 4B show modified examples of the first embodiment, respectively, which show monocrystal regions of FIG. 3 in different states.

In FIG. 4A, a modified example of a form of the monocrystal region 102 is shown. In this example, gaps 103 are provided between the end portion of the monocrystal regions 102 and each source-drain region 101 (low impurity concentration regions 10, 11).

Even when such gaps 103 are provided, the same effect as that of the example in FIG. 3 can be attained if the width d of the gap 103 has been set so that electrons can smoothly pass (tunnel) through the gaps 103. The width d is to be set to a value not more than the de Broglie wavelength (about 200 angstroms for silicon).

Figure 6:
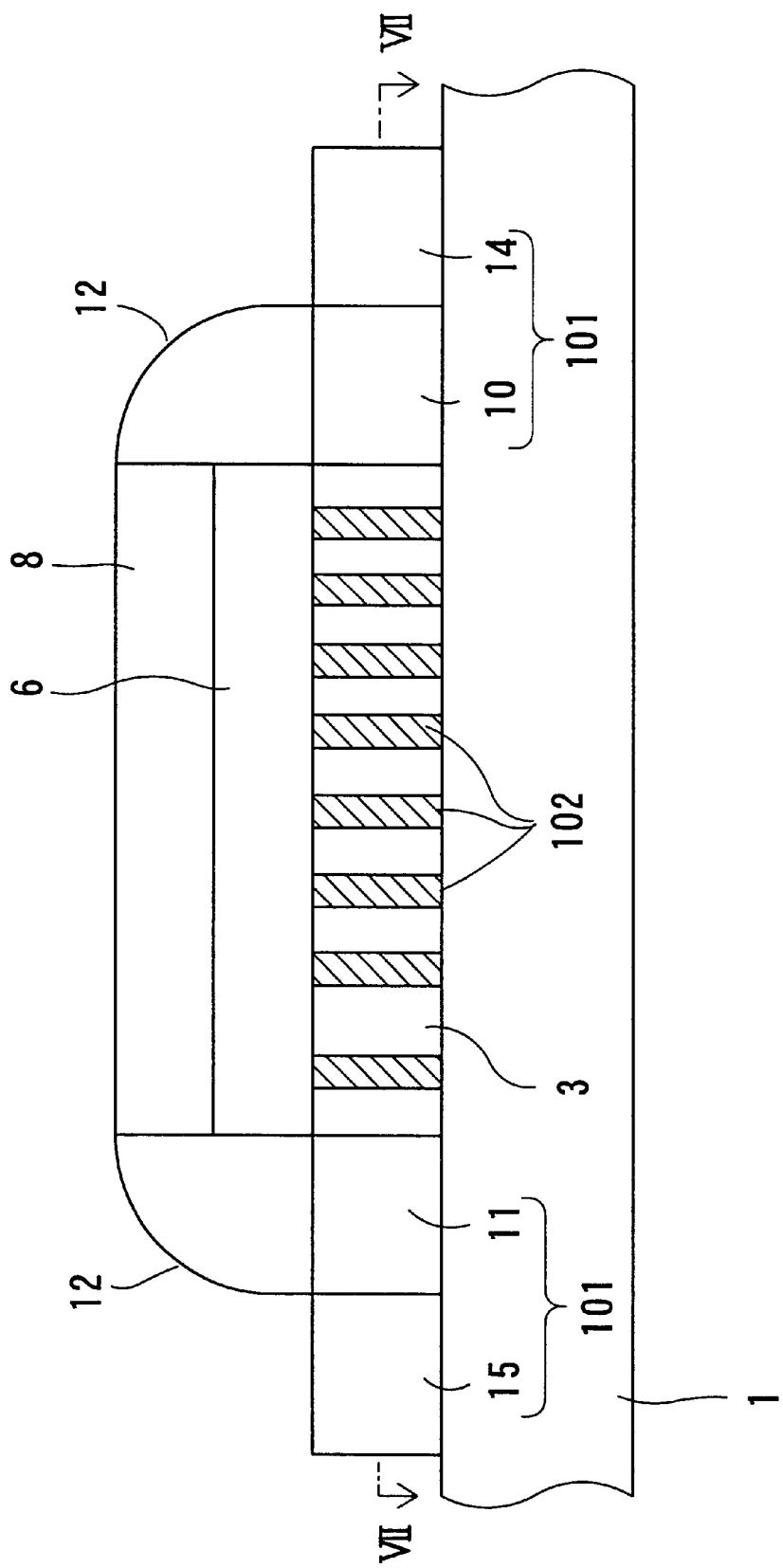
FIG. 6 is a schematic cross-sectional view showing a semiconductor device (polycrystalline silicon TFT) as a modified example of the first embodiment.
Figure 7:
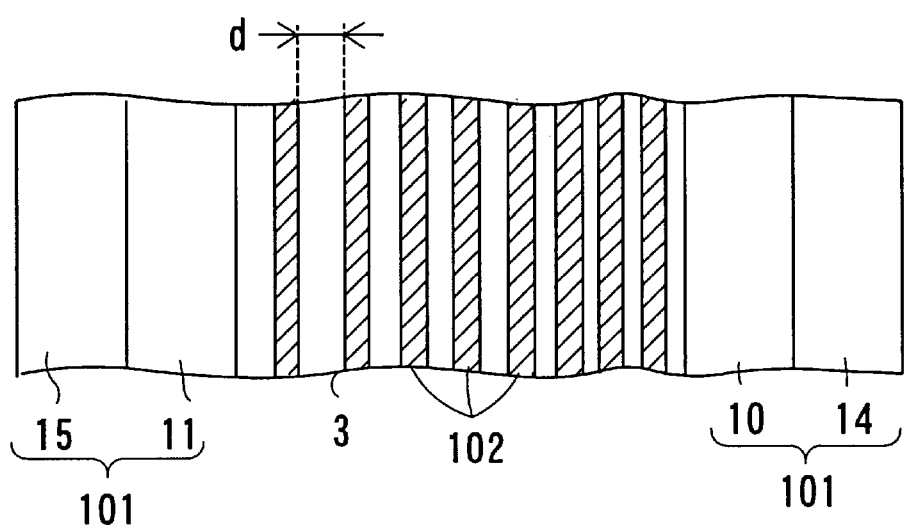
FIG. 7 is a cross-sectional view taken along the line VII—VII in FIG. 6.

FIG. 6 is a schematic cross-sectional view of a modified polycrystalline silicon TFT. FIG. 7 is a cross-sectional view of the polycrystalline silicon film 3 taken along the line VII–VII in FIG. 6.

In the example shown in FIGS. 6 and 7, scanning for laser irradiation is carried out repeatedly in parallel with the source-drain region 101. Consequently, in the channel region of the polycrystalline silicon film 3, a plurality of the monocrystal regions 102 are formed in parallel with each source-drain region 101 and vertically to the transparent insulating substrate 1. In this case, the monocrystal regions 102 are formed uniformly from the upper surface (the side of the gate insulating film 6) to the lower surface (the side of the transparent insulating substrate) of the polycrystalline silicon film 3.

In the example shown in FIGS. 6 and 7, the same effect as that in FIG. 3 can also be attained if the width of the gap d has been set so that electrons can smoothly tunnel through the gap between the monocrystal regions 102.

METHOD 2

Figure 4B:
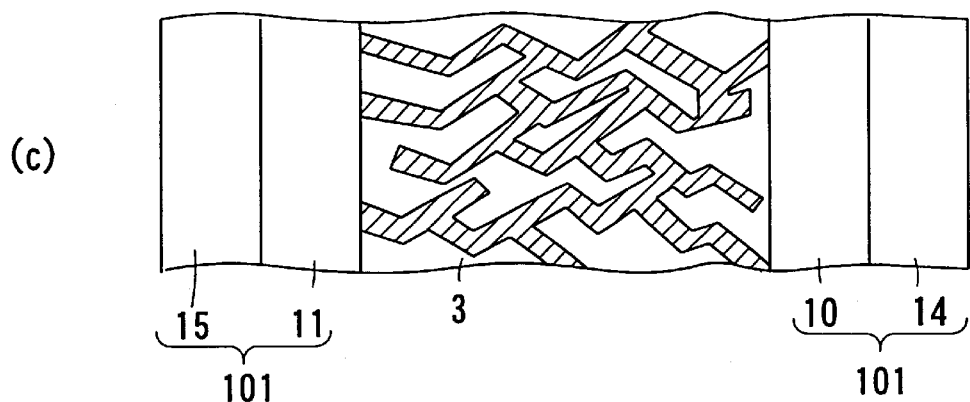

By irradiating a high energy beam into the whole surface of the polycrystalline silicon film 3 and annealing it, monocrystal regions 102 are formed in the irradiated region. As shown in FIG. 4B, crystallization is then advanced from easily crystallizable parts in the channel region of the polycrystalline silicon film 3 and irregularly shaped monocrystal regions 102 are formed.

In the example of FIG. 4B, the same effect as that in FIG. 3 can be attained if the width of the gap is set so that electrons can smoothly pass (tunnel) through the gaps between the monocrystal regions 102.

As the high energy beam, an energy beam irradiated from one of various lamps (a Xe arc lamp, an ultrahigh pressure mercury lamp, a low pressure mercury lamp, a deuterium lamp, a halogen lamp, a Fe/Hg metal-halogen lamp and the like) may be used. In order to make the polycrystalline silicon film 3 efficiently absorb the high energy beam to form the monocrystal regions 102, the wavelength of the beam is preferably about 600 nm or shorter.

Heating of the transparent insulating substrate 1 during the aforementioned high energy beam irradiation promotes formation of the monocrystal regions 102 by the high energy beam irradiation. The heating temperature of the transparent insulating substrate 1 is preferably in the range from about 100° C. to about 600° C., more preferably from about 200° C. to about 400° C. and most preferably from about 300° C. to about 400° C. When the heating temperature is below the range, it is difficult to attain the effect of heating.

METHOD 3

Figure 8:
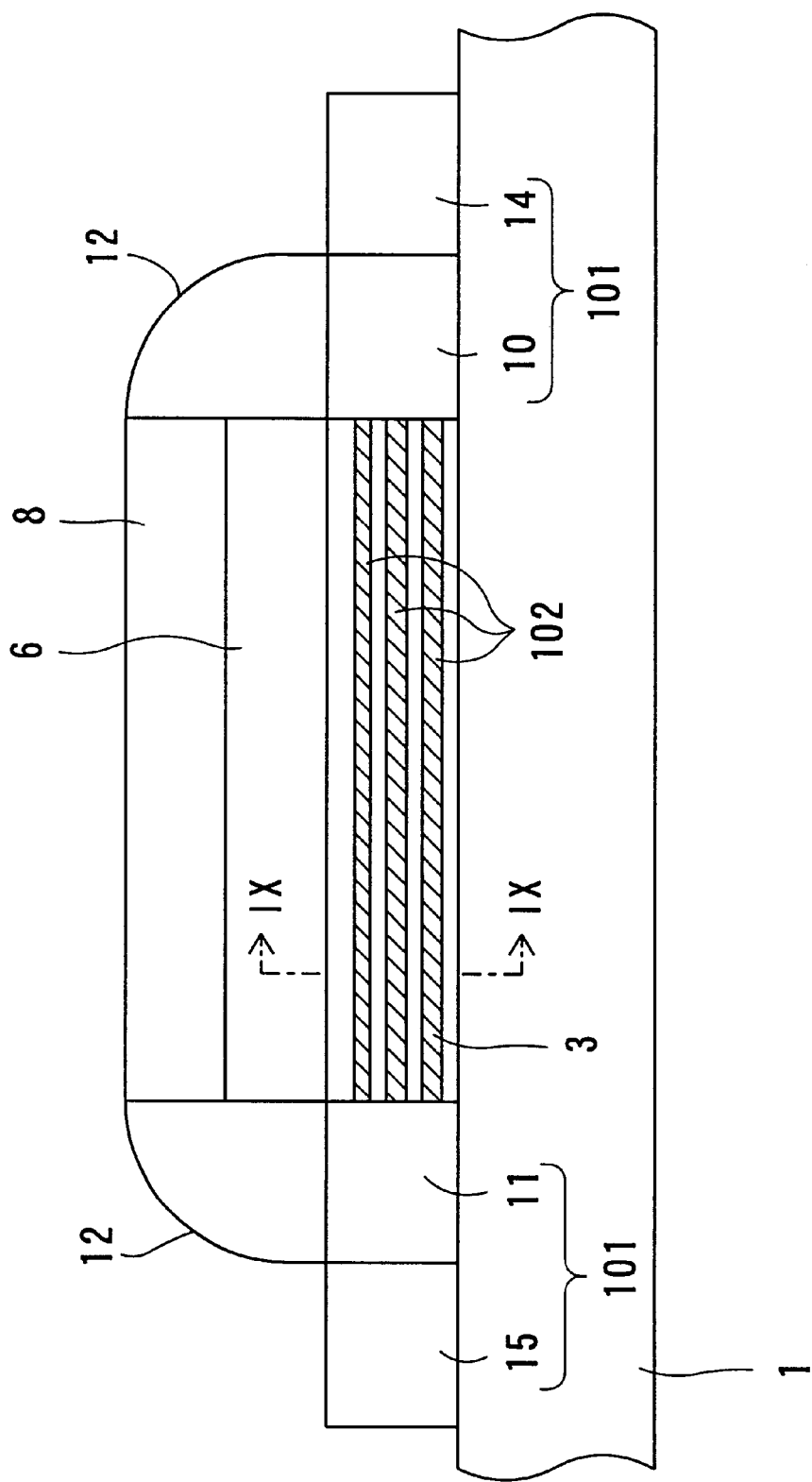
FIG. 8 is a schematic cross-sectional view showing a semiconductor device (polycrystalline silicon TFT) as a further modified example of the first embodiment.
Figure 9:
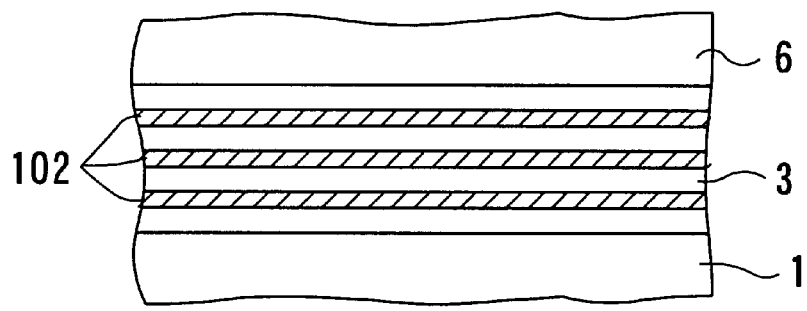
FIG. 9 is a cross-sectional view taken along the line IX—IX of FIG. 8.

A schematic cross sectional view of a further modified polycrystalline silicon TFT is shown in FIG. 8. FIG. 9 is a cross-sectional view of the polycrystalline silicon film 3 taken along the line IX—IX in FIG. 8.

In the previously described step of FIG. 1A, an amorphous silicon film is formed by means of LPCVD (referred to as a LP amorphous silicon film, hereinafter) on the transparent insulating substrate 1. Subsequently, another amorphous silicon film by means of plasma CVD (referred to as a plasma amorphous silicon film) is formed on the LP amorphous silicon film. Then, another LP amorphous silicon film is formed on the plasma amorphous silicon film. By repeating such processes, there is formed an amorphous silicon film 2 in which multiple LP amorphous silicon films and plasma amorphous silicon films are disposed alternately. Then, steps of FIG. 1B to 1D are carried out in the same way as herein before mentioned.

Subsequently, in aforementioned step of FIG. 1E, a high energy beam is irradiated to the whole surface of the polycrystalline silicon film 3 to anneal it. Then, the polycrystalline silicon film formed from the LP amorphous silicon film with high crystallizability is converted to a monocrystal region 102, and the polycrystalline silicon film formed from the plasma amorphous silicon film with low crystallizability does not change. As a result, as shown in FIGS. 8 and 9, multiple monocrystal regions 102 connecting the source-drain regions 101 (between low impurity concentration regions 10 and 11) are formed in the channel region of the polycrystalline silicon film 3 in parallel with the transparent insulating substrate 1.

In the example of FIGS. 8 and 9, the same effect as that of FIG. 3 can be attained.

In order to prepare a product shown in FIGS. 8 and 9, the production method is not limited to the aforementioned method. The following method can also be applied. Firstly, aforementioned steps of FIGS. 1A to 1D are carried out to form a polycrystalline silicon film 3 on a transparent insulating substrate 1, and after these processes, high energy beam irradiation is applied to the whole surface of the device in aforementioned step of FIG. 1E to form monocrystal regions 102 on the polycrystalline silicon film 3. Subsequently, another polycrystalline silicon film 3 is formed on the monocrystal region 102 by carrying out aforementioned steps of FIGS. 1A to 1D. By repeating such procedures, polycrystalline silicon films 3 and monocrystal regions 102 may be alternately disposed to prepare the product.

Also in the example of FIGS. 8 and 9, even when gaps are formed between the end parts of the monocrystal regions 102 and the source-drain regions 101 (low impurity concentration regions 10 and 11) like the example shown in FIG. 4A, the same effect as in FIG. 3 can be attained if the width of the gap is set so that electrons can pass (tunnel) through the gaps.

In the following, a manufacturing process of a liquid crystal display (LCD) using a polycrystalline silicon TFT of the first embodiment as a picture element driving element will be described referring to FIG. 10.

Firstly, after forming a polycrystalline TFT of the first embodiment, a storage electrode 17 comprising ITO (Indium Tin Oxide) and constituting an auxiliary capacitor is formed on a display picture element region of a transparent insulating substrate 1 by means of sputtering. The storage electrode 17 may be formed at the same time as the polycrystalline silicon film 3 doped with phosphorus which functions as an active layer of the polycrystalline silicon TFT.

Secondly, an interlayer insulating film 33 is formed over the whole surface of the device. A silicon oxide film, silicate glass, a silicon nitride film or the like is used as a raw material for the interlayer insulating film 33. CVD or PCVD is used for the formation of the film. Thereafter, contact holes 19 reaching high impurity regions 14, 15 are formed through the interlayer insulating region 33. Then, after an AlSi layer is formed on the upper surface of the interlayer insulating film 33, while the contact holes 19 are filled up with AlSi, source-drain electrodes 18 are formed by patterning the AlSi layer.

Subsequently, after another interlayer insulating film 16 is formed so as to cover the interlayer insulating film 33 and the source-drain electrode 18, a contact hole is formed in a region on one of the source-drain electrodes 18 in the interlayer insulating film 16. After an ITO film is formed on the upper surface of the interlayer insulating film 16 while the contact hole is filled with ITO, a display electrode 20 is formed by patterning the ITO film.

Next, an oriented film 29 is formed over the display electrode 20 and the interlayer insulating film 16.

The transparent insulating substrate 1, on which a polycrystalline silicon TFT is formed, is disposed so as to face another transparent insulating substrate 22, on which a common electrode 21 and an oriented film 29 are formed. A liquid crystal is filled and sealed between the two insulating substrates 1 and 22 to form a liquid crystal layer 23. Display picture elements of an LCD are thus completed.

Figure 11:
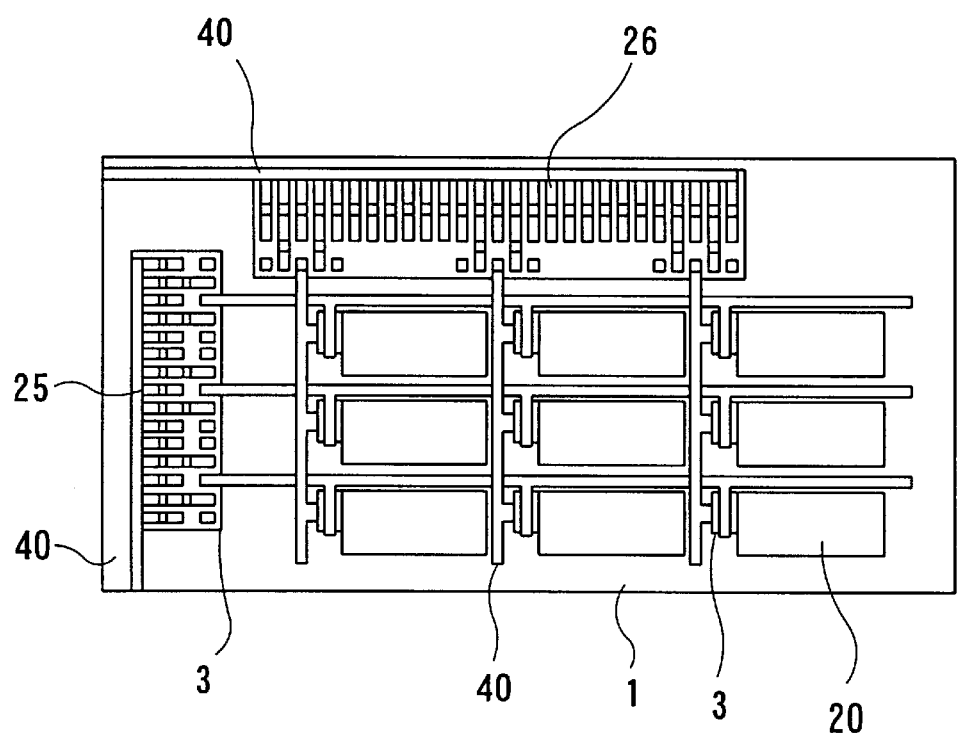
FIG. 11 is a schematic plan view showing a liquid crystal display panel in which display picture elements and driving circuits are formed on the same substrate.

A liquid crystal display panel, which is provided with display picture elements and driving circuits on a single substrate is shown in FIG. 11.

In this liquid crystal display panel, active layers of driving circuits (a gate driver 25 and a drain driver 26) and of display picture elements are constituted by polycrystalline silicon films 3. In the display picture elements are multiple display electrodes 20 disposed in a matrix arrangement.

The display electrodes 20 are connected by signal wiring 40 with one another. Signal wiring 40 are also connected to the gate driver 25 and the drain driver 26.

Figure 12:
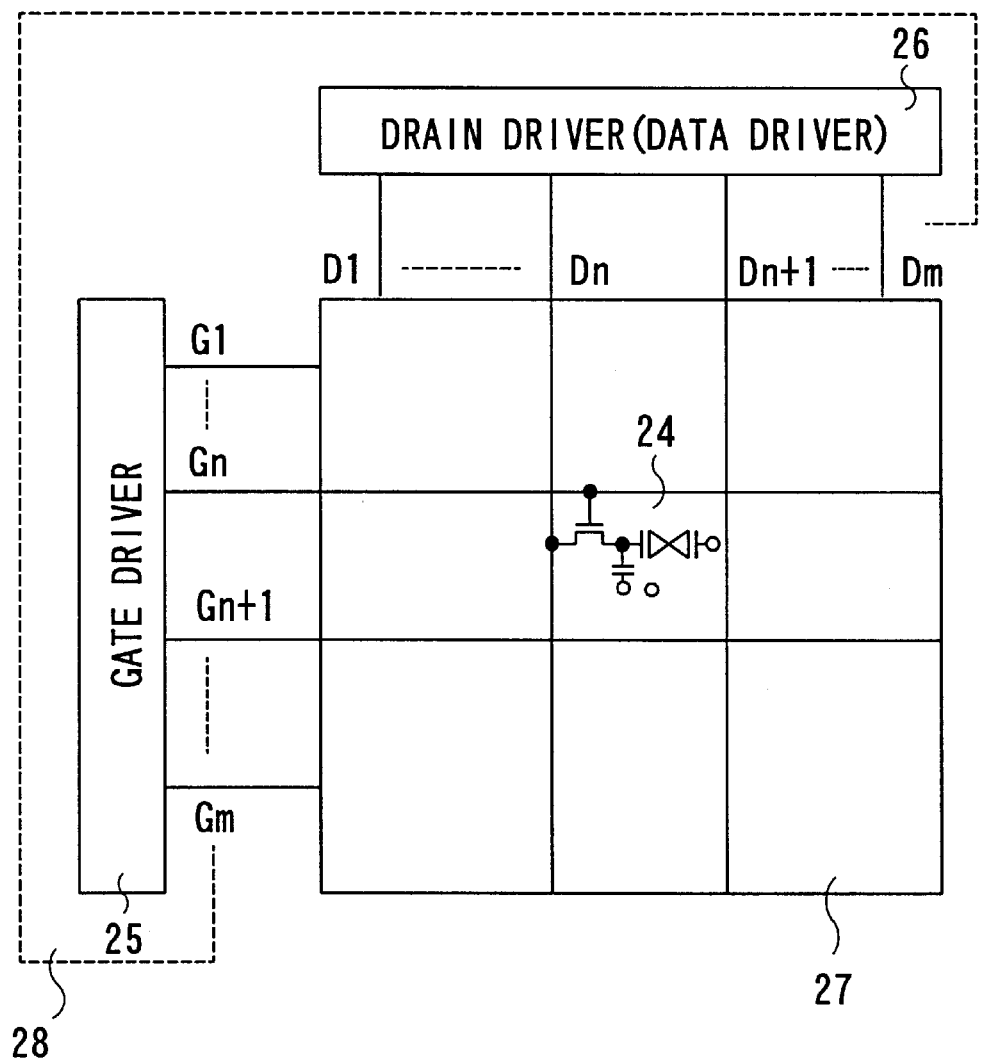
FIG. 12 is a block diagram of a circuit of an LCD.

FIG. 12 is a block diagram of an active-matrix LCD to which the polycrystalline silicon TFT of the first embodiment is applied.

A display picture arrangement 27 comprises scan wiring (gate wiring), G1 . . . Gn, Gn+1 . . . Gm, and data wiring (drain wiring), D1 . . . Dn, Dn+1 . . . Dm. Each gate wiring crosses perpendicularly with each drain wiring and a picture element 24 is provided at the crossing part of the wiring. Each gate wiring is connected to the gate driver 25 and a gate signal (scan signal) is applied to each gate wiring.

Each drain wiring is connected to the drain driver (data driver) 26 and a data signal (video signal) is applied to each drain wiring.

Driving circuits 28 are composed of the gate driver 25 and the drain driver 26.

An LCD in which the display picture arrangement 27 and at least one of the gate driver 25 and the drain driver 26 are formed together on the same substrate is usually called an LCD of an integral driver type (an LCD of a built-in driver type). Occasionally, the gate drivers 25 are provided on both sides of the display picture arrangement 27 or the drain drivers 26 are provided on both sides of the display picture arrangement 27.

In the LCD of FIG. 12, the polycrystalline silicon TFT of the first embodiment is used not only for the picture element driving element of the picture element 24 but also for the transistor constituting the driving circuits 28. In this case, the polycrystalline TFT used for the picture element 24 and the polycrystalline silicon TFT used for the driving circuits 28 are formed on the same transparent insulating substrate 1 in parallel with each other during the manufacturing of the LCD.

Figure 13:
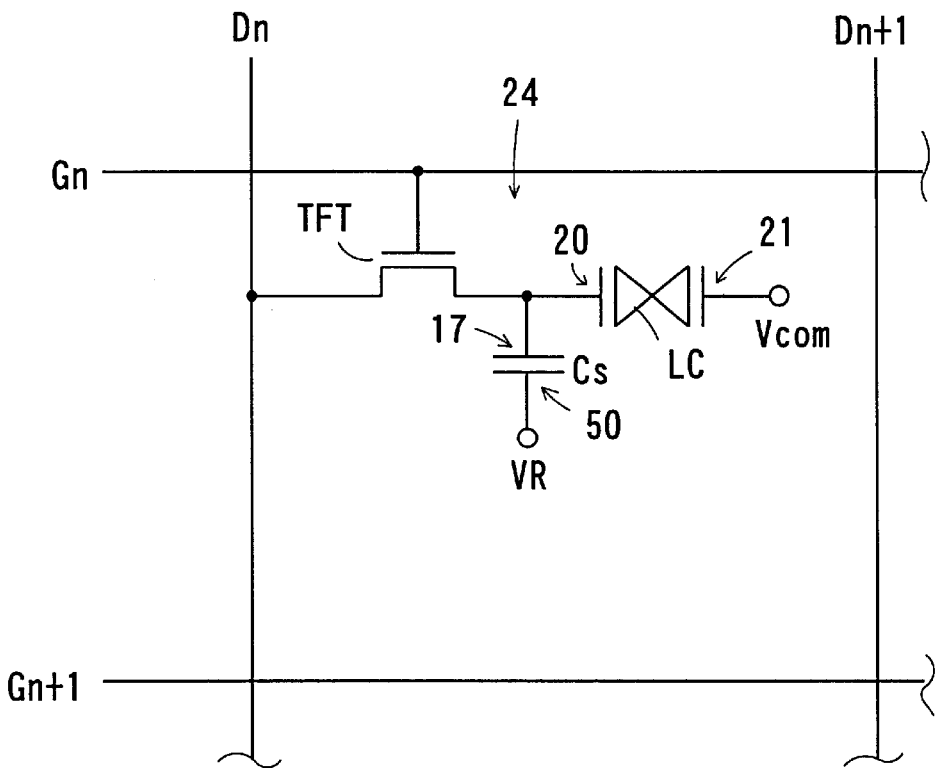
FIG. 13 is an equivalent circuit diagram of a picture element of an LCD.

In FIG. 13 is shown an equivalent circuit of a picture element provided at the crossing part of the gate wiring Gn and the drain wiring Dn.

The picture element 24 comprises a TFT as a picture element driving element, a liquid crystal cell LC and an auxiliary capacitor Cs. A gate of the TFT is connected to the gate wiring Gn and a drain of the TFT is connected to the drain wiring Dn. A display electrode (a picture element electrode) 20 of the liquid crystal cell LC and an auxiliary capacitor electrode 17 (a storage electrode or a load capacitance electrode) are connected to a source of the TFT.

A signal storing element is composed of the liquid crystal cell LC and the auxiliary capacitor Cs. A voltage Vcom is applied to a common electrode 21 of the liquid crystal cell LC (an electrode opposite to the display electrode 20). Alternatively, a constant voltage VR is applied, in the auxiliary capacitor Cs, to an opposite electrode 50 situated oppositely to the electrode connected to the TFT source. The common electrode 21 of the liquid crystal cell LC functions as a common electrode for all the picture elements 24. A capacitance is formed between the display electrode 20 of the liquid crystal cell LC and the common electrode 21. In the auxiliary capacitor Cs, the opposite electrode 50 is occasionally connected to a next gate wiring Gn+1.

In the picture element 24 composed as mentioned above, the TFT is turned on (ON state), when a positive voltage is applied to the gate of the TFT by applying a positive voltage to the gate wiring Gn. In this state, the electric charge corresponding to the data signal applied to the drain wiring Dn is stored in the capacitance of the liquid crystal cell LC and the auxiliary capacitor Cs.

On the other hand, the TFT is turned off, when a negative voltage is applied to the gate of the TFT by applying a negative voltage to the gate wiring Gn. In this state, the voltage applied to the drain wiring Dn is held by the capacitance of the liquid crystal cell LC and the auxiliary capacitor Cs.

By giving the drain wiring a data signal to be written in the picture element 24 and controlling the voltage of the gate wiring, an arbitrary data signal can be held in the picture element 24. The transmittance of the liquid crystal cell LC changes in accordance with the data signal held by the picture element 24 and a picture is thus displayed.

As described above in detail, a polycrystalline silicon TFT with high electric field effect mobility can be obtained by providing a monocrystal region 102 in a channel region of a polycrystalline silicon film 3 used as an active layer. By converting only a portion of the polycrystalline silicon film 3 into a monocrystal region 102, the manufacturing TAT (Turn Around Time) can be shortened and the manufacturing cost can be decreased compared with a case where the whole polycrystalline silicon film 3 is monocrystallized.

Also, when a polycrystalline silicon TFT with such high electric field effect mobility is used for an LCD, high detail and high density of the display picture arrangement 27 can be attained, while high mobility of the driving circuits 28 can also be attained. The display performance of the LCD is thus improved.

As shown in FIG. 5, electric field effect mobility necessary for the display picture arrangement 27 and the driving circuits 28, respectively, can be easily obtained by arbitrarily determining the ratio of the space occupied by the monocrystal region 102 in the cross section of the polycrystalline silicon film 3 along the line Y—Y.

The Second Embodiment

Figure 14A:
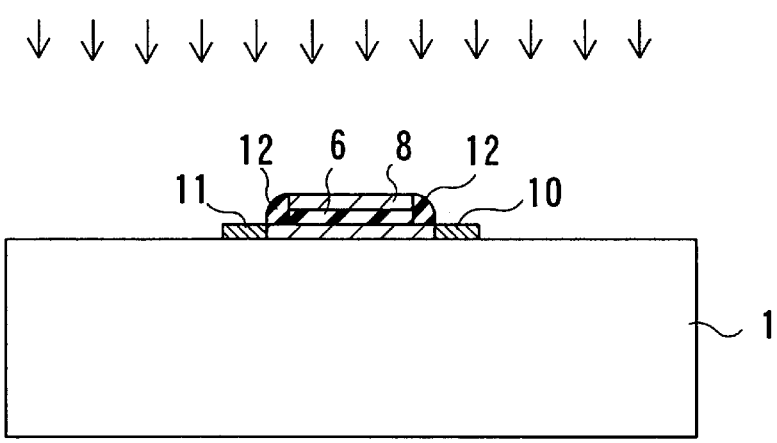
FIGS. 14A and 14B are schematic cross-sectional views illustrating a manufacturing process of a semiconductor device (polycrystalline silicon TFT) according to a second embodiment of the invention.
Figure 14B:
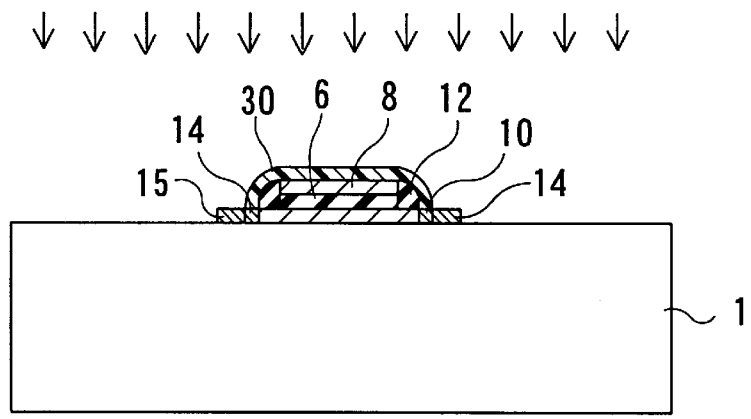

A manufacturing method of a semiconductor device (a polycrystalline silicon TFT) of the second embodiment will be described, referring to FIGS. 14A and 14B.

An offset structure is adopted in a polycrystalline silicon TFT of the second embodiment, while an LDD structure is adopted in a polycrystalline silicon TFT of the first embodiment.

When an offset structure is formed, implantation of impurities in aforementioned step of FIG. 1J of the first embodiment is not carried out. As shown in FIG. 14A, impurities are implanted after side walls 12 have been formed and low impurity concentration regions 10, 11 are thus formed. Then, as shown in FIG. 14B, a resist film 30 is formed in such a way that it covers the side wall 12 and a gate electrode 8. Subsequently, by implanting impurities using the resist film 30 as a mask, high impurity concentration regions 14, 15 are formed.

Therefore, a polycrystalline silicon TFT of an offset type can be easily manufactured by only partially changing the manufacturing processes of the first embodiment.

The Third Embodiment

A manufacturing method of a semiconductor device of the third embodiment of the invention will be described, referring to FIGS. 15A to 15K. Explanation for the same process steps in the third embodiment as those in the first embodiment is omitted.

In a polycrystalline silicon TFT of the third embodiment, a bottom gate type is adopted where a gate electrode 8 is disposed under a polycrystalline silicon film 3, while in a polycrystalline silicon TFT of the first and second embodiments, a top gate type is adopted in which a gate electrode 8 is disposed on a polycrystalline silicon film 3.

Figure 15A:
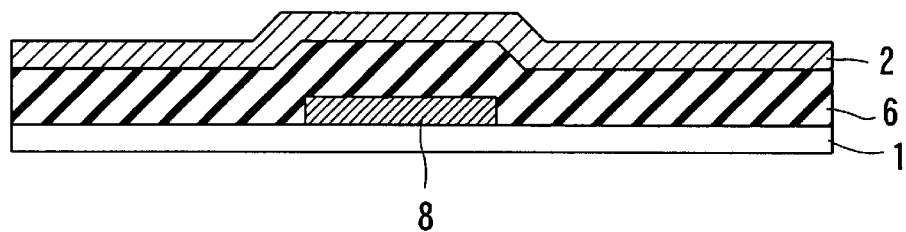

In FIG. 15A, a gate electrode 8 is formed on a transparent insulating substrate 1. An interlayer insulating film 6 is subsequently formed so as to cover the gate electrode 8. Then, an amorphous silicon film 2 is formed on the interlayer insulating film 6 by means of LPCVD.

Figure 15B:
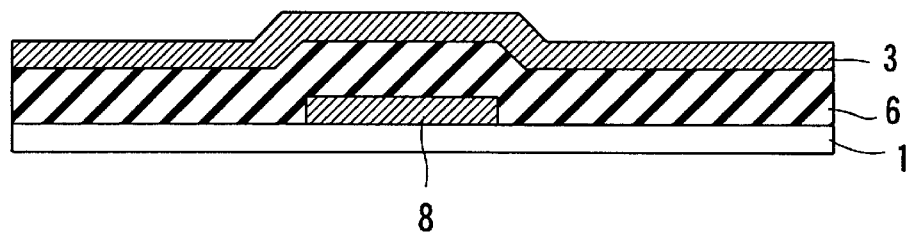

In FIG. 15B, an amorphous silicon film 2 is polycrystallized and converted to a polycrystalline silicon film 3 by means of a solid phase epitaxy.

Figure 15C:
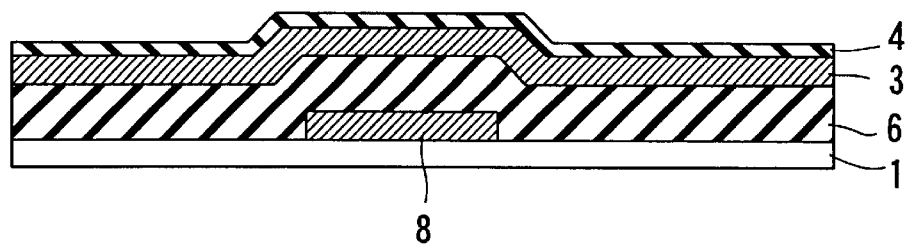

In FIG. 15C, a surface of the polycrystalline silicon film 3 is oxidized by means of wet oxidizing to form a silicon dioxide film 4.

In FIG. 15D, the surface of the polycrystalline silicon film 3 is exposed by removing the silicon dioxide film 4 by means of wet etching.

In FIG. 15E, a monocrystal region is formed in a portion where a channel region between source-drain regions is to be formed in the polycrystalline silicon film 3.

In FIG. 15F, a rapid heat treatment is carried out by means of RTA. The heat treatment conditions are the same as those of the step of FIG. 1G in the first embodiment.

Figure 15G:
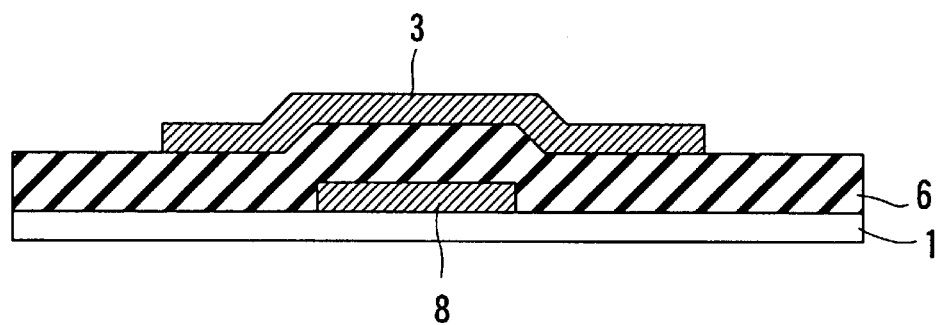

In FIG. 15G, patterning of the polycrystalline silicon film 3 which has been provided with a monocrystal region and heat-treated is carried out by means of the photolithography technique and the dry etching technique by RIE. The patterning is carried out so that the polycrystalline silicon film 3 may remain only on the portion where the polycrystalline silicon TFT is to be formed.

Figure 15H:
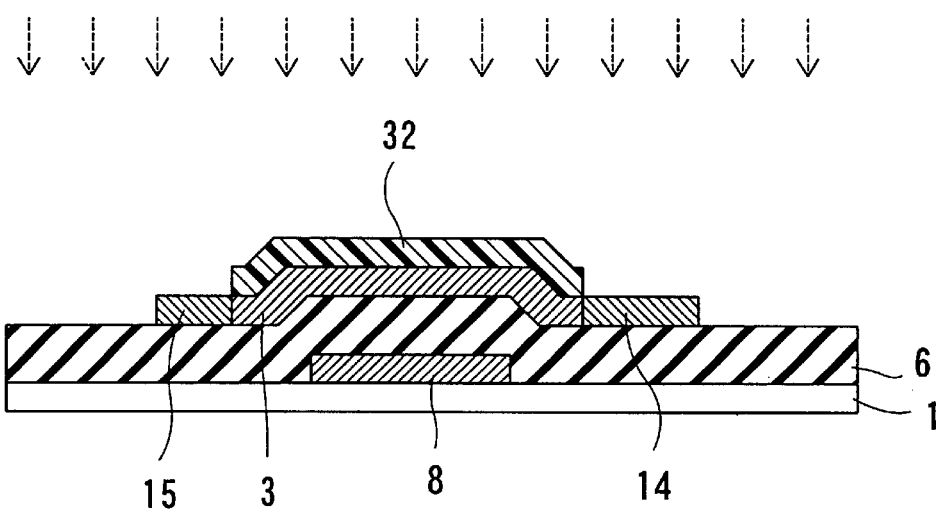

In FIG. 15H, a resist film 32 is formed on the channel region of the polycrystalline silicon film 3. High impurity concentration regions 14, 15 are formed by ion-implanting impurities to the polycrystalline silicon film 3 using the resist film 32 as a mask. Thereafter, the resist film 32 is removed.

Figure 15I:
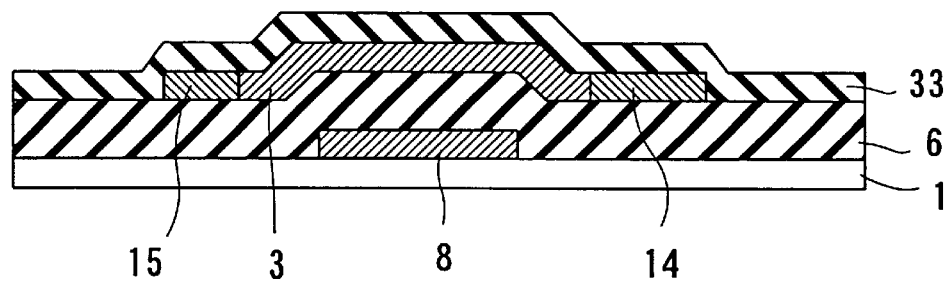

In FIG. 15I, another interlayer insulating film 33 is formed so as to cover the polycrystalline silicon film 3 and the interlayer insulating film 6.

Figure 15J:
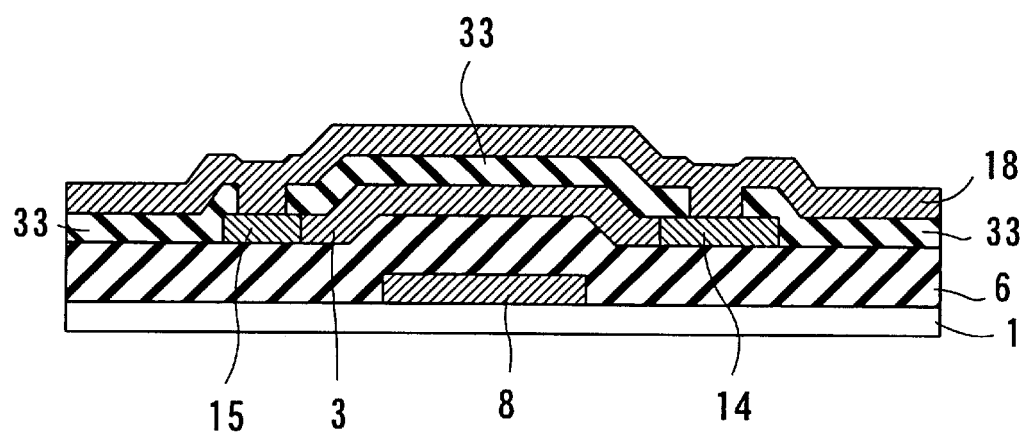

In FIG. 15J, after contact holes are made at the portions situated on the high impurity concentration regions 14,15 of the interlayer insulating film 33, an AlSi film, which is to be source-drain electrodes 18, is formed so as to cover the surface of the interlayer film 33 and fill up the contact holes.

Figure 15K:
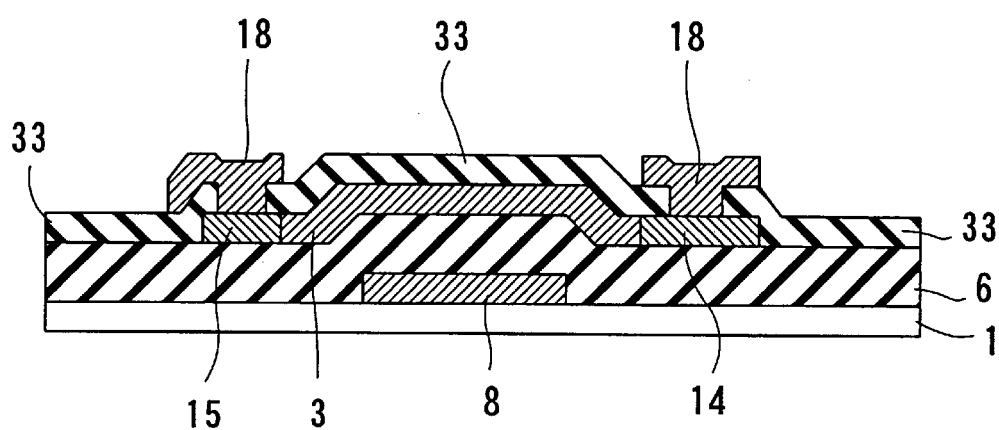

In FIG. 15K, source-drain electrodes 18 are formed by patterning the AlSi film.

According to aforementioned processes, a polycrystalline silicon TFT of a bottom-gate type with source-drain regions of SD (Single Drain) type consisting of high impurity concentration regions 14, 15 is completed, using, as an active layer, a polycrystalline silicon film 3 in which a monocrystal region is formed. In the polycrystalline silicon TFT of a bottom-gate type in the third embodiment, the same effect as that of the first embodiment can be attained by providing a monocrystal region 102 in a channel region of a polycrystalline silicon film 3, using aforementioned Methods 1 to 3 of the first embodiment.

Figure 16:
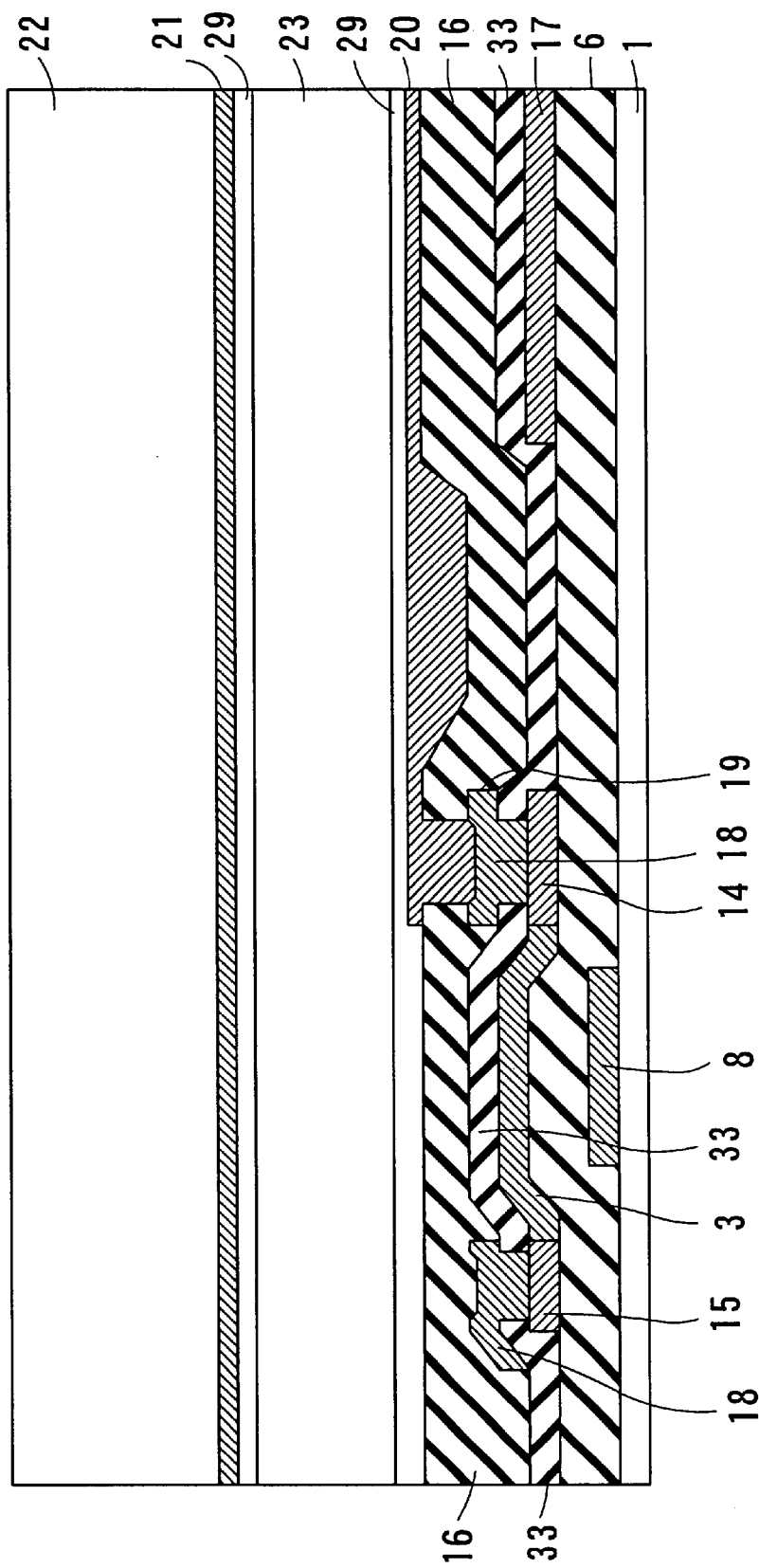
FIG. 16 is a schematic cross-sectional view showing an LCD using a polycrystalline silicon TFT of the third embodiment.

FIG. 16 is a schematic cross-sectional view of an LCD using a polycrystalline silicon TFT as a picture element driving element.

Figure 10:
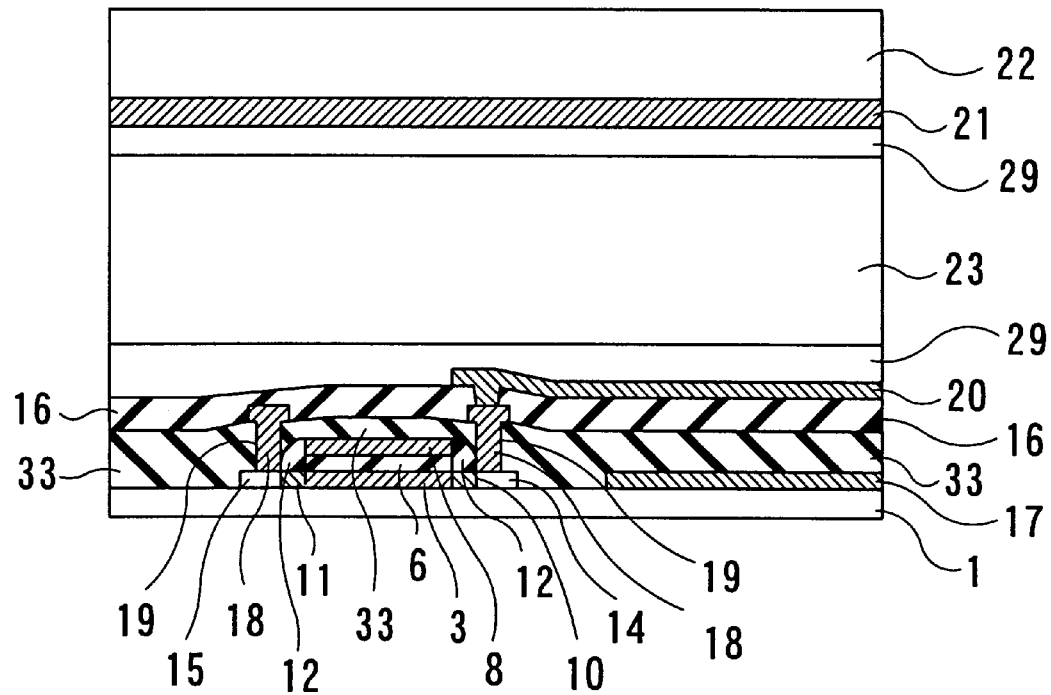
FIG. 10 is a schematic cross-sectional view showing an LCD using a polycrystalline silicon TFT of the first embodiment.

The LCD shown in FIG. 16 differs from the LCD shown in FIG. 10 only in the use of a polycrystalline silicon TFT of a bottom-gate type.

The invention is not limited to the above-mentioned embodiments and may be modified as follows. The same effect as in the above-mentioned embodiments can be attained in these examples.

(1) An amorphous silicon film 2 may be replaced by a film of an amorphous semiconductor other than silicon, such as silicon germanium (SiGe), selenium (Se), germanium (Ge), arsenic gallium (GaAs), gallium nitride (GaN) and silicon carbide (SiC).

(2) A melting and recrystallizing method by laser anneal or RTA may be used instead of solid phase epitaxy, as a method for polycrystallizing an amorphous silicon film 2 to convert it to a polycrystalline silicon film 3.

(3) A silicon dioxide film 4 formed on the surface of a polycrystalline silicon film 3 in aforementioned step of FIG. 1C may be formed not by a dry oxidizing method but by a wet oxidizing method.

(4) Instead of providing a monocrystal region 102 in a channel region of a polycrystalline silicon film 3, the polycrystalline silicon film 3 may be replaced by an amorphous silicon film 2 and a monocrystal region 102 may be formed in a channel region of the amorphous silicon film 2. Specifically, the invention is applied not to a polycrystalline silicon TFT but to a TFT in which an amorphous silicon film 2 is used as an active layer, and a monocrystal region 102 is provided in the channel region of the amorphous silicon film 2.

In order to manufacture a TFT having such a structure, aforementioned step of FIG. 1B or FIG. 15B is skipped and a monocrystal region 102 is formed in a portion which is to be a channel region between source-drain regions on an amorphous silicon film 2 in aforementioned step of FIG. 1E or FIG. 15E.

In this instance, electric field effect mobility can be heightened by providing the monocrystal region 102, since electrons pass mainly through the monocrystal region 102, though electrons cannot smoothly pass through the channel region of the amorphous silicon film 2.

(5) Instead of providing a monocrystal region 102 in a channel region of a polycrystalline silicon film 3, the polycrystalline silicon film 3 may be replaced by an amorphous silicon film 2 and a polycrystal region may be provided in the channel region of the amorphous silicon film 2. Specifically, the invention is applied not to a polycrystalline silicon TFT but to a TFT in which an amorphous silicon film 2 is used as an active layer, and a polycrystal region equivalent to a monocrystal region 102 is provided in the channel region of the amorphous silicon film 2.

For manufacturing a TFT having such a structure, aforementioned step of FIG. 1B or FIG. 15B is skipped and a polycrystal region is formed in a portion to be a channel region between source-drain regions of an amorphous silicon film 2 in the step of FIG. 1E or FIG. 15E. When the polycrystal region is formed, the laser irradiation conditions or the high energy beam irradiation conditions may be changed properly, so as to stop the irradiation before the amorphous silicon 2 has been monocrystallized.

In this instance, electrons cannot smoothly pass through the channel region of the amorphous silicon film 2, but can pass mainly through the polycrystal region. Therefore, electric field effect mobility can be heightened.

(6) A transparent insulating substrate 1 may be replaced by an insulating film formed on a semiconductor substrate. That is, a TFT of the invention is formed not on the transparent insulating substrate 1 but on the insulating film formed on the semiconductor substrate.

(7) The invention may be applied to a polycrystalline silicon TFT of a bottom-gate type with an LDD structure.

What is claimed is:

1. A semiconductor device comprising:
    an insulating substrate;
    a non-monocrystalline semiconductor film on said insulating substrate which functions as a channel region of a transistor and as source-drain regions located across said channel region; and
    at least one crystalline semiconductor region, within the non-monocrystalline semiconductor film of said channel region, of a crystalline semiconductor whose properties are different from those of said non-monocrystalline semiconductor film.

2. The semiconductor device according to claim 1, wherein said non-monocrystalline semiconductor film is an amorphous semiconductor film and said crystalline semiconductor is a monocrystalline semiconductor.

3. The semiconductor device according to claim 1, wherein said non-monocrystalline semiconductor film is an amorphous semiconductor film and said crystalline semiconductor is a polycrystalline semiconductor.

4. A semiconductor device comprising:
    an insulating substrate;
    a non-monocrystalline semiconductor film on said insulating substrate which functions as a channel region of a transistor and as source-drain regions located across said channel region; and
    at least one crystalline semiconductor region, in the non-monocrystalline semiconductor film of said channel region, of a crystalline semiconductor whose properties are different from those of said non-monocrystalline semiconductor film,
    wherein said at least one crystalline semiconductor region is perpendicular to said insulating substrate and connects the source-drain regions located across said channel region.

5. The semiconductor device according to claim 1, wherein said at least one crystalline semiconductor region is formed in parallel with said insulating substrate and connects the source-drain regions located across said channel region.

6. A semiconductor device comprising:
    an insulating substrate;
    a non-monocrystalline semiconductor film on said insulating substrate which functions as a channel region of a transistor and as source-drain regions located across said channel region;
    at least one crystalline semiconductor region, in the non-monocrystalline semiconductor film of said channel region, of a crystalline semiconductor whose properties are different from those of said non-monocrystalline semiconductor film; and
    a gap being between said crystalline semiconductor region and the source-drain regions, the width of said gap being set so that electrons can easily pass through said gap.

7. A semiconductor device comprising:
    an insulating substrate;
    a non-monocrystalline semiconductor film on said insulating substrate which functions as a channel region of a transistor and as source-drain regions located across said channel region; and
    at least one crystalline semiconductor region, in the non-monocrystalline semiconductor film of said channel region, of a crystalline semiconductor whose properties are different from those of said non-monocrystalline semiconductor film, wherein said at least one crystalline semiconductor region is formed in parallel with the source-drain regions located across said channel region as well as vertically to said insulating substrate.

8. A semiconductor device comprising:
    an insulating substrate;
    a non-monocrystalline semiconductor film on said insulating substrate which functions as a channel region of a transistor and as source-drain regions located across said channel region; and
    at least one crystalline semiconductor region, in the non-monocrystalline semiconductor film of said channel region, of a crystalline semiconductor whose properties are different from those of said non-monocrystalline semiconductor film,
    wherein said at least one crystalline semiconductor region comprises multiple monocrystal regions, gaps being formed between said multiple monocrystal regions, the width of each said gap being set so that electrons can smoothly pass through said gaps.

9. A semiconductor device comprising:
    an insulating substrate;
    a non-monocrystalline semiconductor film on said insulating substrate which functions as a channel region of a transistor and as source-drain regions located across said channel region; and
    at least one crystalline semiconductor region, in the non-monocrystalline semiconductor film of said channel region, of a crystalline semiconductor whose properties are different from those of said non-monocrystalline semiconductor film,
    wherein said at least one crystalline semiconductor region comprises multiple polycrystal regions, gaps being formed between said multiple polycrystal regions, the width of each said gap being set so that electrons can smoothly pass through said gaps.

10. The semiconductor device according to of claim 1, wherein a gate electrode is provided, via a gate insulating film, on said channel region on said insulating substrate, to provide a transistor of a top-gate type.

11. The semiconductor device according to claim 1, wherein a gate electrode is provided directly on said insulating substrate, said channel region is on the gate insulating film provided on said gate electrode, to provide a transistor of a bottom-gate type.

12. A liquid crystal display comprising:
    a pair of spaced insulating substrates;
    a display electrode disposed on one of said pair of insulating substrates and defining a picture element;
    a liquid crystal disposed between said pair of insulating substrates; and
    a transistor for driving the picture element, formed on one side of said pair of insulating substrates,
    said transistor comprising:

a non-monocrystalline semiconductor film formed on one of said pair of insulating substrates which functions as a channel region of said transistor;

a crystalline semiconductor region, of a crystalline semiconductor, within said semiconductor film, whose properties are different from those of said non-monocrystalline semiconductor film;

source-drain regions located across said channel region; and a gate electrode provided on said channel region via a insulating film.

13. The liquid crystal display according to claim 12, wherein said non-monocrystalline semiconductor film is an amorphous semiconductor film and said crystalline semiconductor is a monocrystalline semiconductor.

14. The liquid crystal display device according to claim 12, wherein said non-monocrystalline semiconductor film is an amorphous semiconductor film and said crystalline semiconductor is a polycrystalline semiconductor.

15. A liquid crystal display comprising:

a pair of spaced insulating substrates;

a display electrode disposed on one of said pair of insulating substrates and defining a picture element;

a liquid crystal disposed between said pair of insulating substrates; and a transistor for driving the picture element, formed on one of said pair of insulating substrates;

said transistor comprising:

a non-monocrystalline semiconductor film which functions as a channel region of said transistor;

a crystalline semiconductor region, of a crystalline semiconductor, within said semiconductor film whose properties are different from those of said non-monocrystalline semiconductor film;

source-drain regions located across said channel region; and a gate electrode formed directly on one of said pair of insulating substrates and disposed at a location corresponding to said channel region.

16. The liquid crystal display according to claim 15, wherein said non-monocrystalline semiconductor film is an amorphous semiconductor film and said crystalline semiconductor is a monocrystalline semiconductor.

17. A liquid crystal display according to claim 15, wherein said non-monocrystalline semiconductor film is an amorphous semiconductor film and said crystalline semiconductor is a polycrystalline semiconductor.

18. A semiconductor device comprising:

an insulating substrate;

a polycrystalline semiconductor film on said insulating substrate which functions as a channel region of a transistor and as source-drain regions located across said channel region; and at least one crystalline semiconductor region, in the polycrystalline semiconductor film of said channel region, of a monocrystalline semiconductor whose properties are different from those of said polycrystalline semiconductor film.

19. A liquid crystal display comprising:

a pair of spaced insulating substrates;

a display electrode disposed on one of said pair of insulating substrates and defining a picture element;

a liquid crystal disposed between said pair of insulating substrates; and a transistor for driving the picture element, formed on one side of said pair of insulating substrates, said transistor comprising:

a polycrystalline semiconductor film formed on one of said pair of insulating substrates which functions as a channel region of said transistor;

at least one crystalline semiconductor region, of a monocrystalline semiconductor, in said polycrystalline semiconductor film, whose properties are different from those of said polycrystalline semiconductor film, source-drain regions located across said channel region; and a gate electrode provided on said channel region via a insulating film.

20. A liquid crystal display comprising:

a pair of spaced insulating substrates;

a display electrode disposed on one of said pair of insulating substrates and defining a picture element;

a liquid crystal disposed between said pair of insulating substrates; and a transistor for driving the picture element, formed on one of said pair of insulating substrates;

said transistor comprising:

a polycrystalline semiconductor film which functions as a channel region of said transistor;

at least one crystalline semiconductor region, of a monocrystalline semiconductor, in said polycrystalline semiconductor film whose properties are different from those of said polycrystalline semiconductor film;

source-drain regions located across channel region; and a gate electrode formed directly on one of said pair of insulating substrates and disposed at a location corresponding to said channel region.

* * * * *